(12) United States Patent
LaGrotta et al.

(10) Patent No.: US 6,213,578 B1
(45) Date of Patent: Apr. 10, 2001

(54) MOUNTING ASSEMBLY FOR AN ENCLOSURE

(75) Inventors: Richard Thomas LaGrotta, Livingston; James T. LaGrotta, Boonton; Manuel G. Orellana, Long Valley, all of NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/373,077

(22) Filed: Aug. 11, 1999

(51) Int. Cl.$^7$ ................................................ A47B 88/00
(52) U.S. Cl. ...................... 312/351; 312/223.2; 411/107; 411/172
(58) Field of Search .............................. 312/223.1, 223.2, 312/351, 351.1; 248/678, 672, 918, 346.03; 403/342, 343; 411/107, 172, 82, 171, 383; 361/752, 753, 758, 759, 801, 807

(56) References Cited

U.S. PATENT DOCUMENTS

| | | | |
|---|---|---|---|
| 3,058,211 | * 10/1962 | Axtell | 411/107 X |
| 4,270,820 | * 6/1981 | McMullan et al. | 312/351 X |
| 4,484,833 | * 11/1984 | Gallagher, Jr. | 403/343 X |
| 5,393,164 | * 2/1995 | Renner et al. | 411/171 X |
| 5,411,347 | * 5/1995 | Bowmer et al. | 403/343 X |
| 5,579,986 | * 12/1996 | Sherry et al. | 411/171 X |
| 5,786,989 | * 7/1998 | Kawabe | 361/759 |
| 5,978,232 | * 11/1999 | Jo | 312/223.2 |
| 6,000,559 | * 12/1999 | Stopyra et al. | 361/752 X |
| 6,002,588 | * 12/1999 | Vos et al. | 361/685 X |
| 6,017,176 | * 1/2000 | Marui | 411/82 |
| 6,034,876 | * 3/2000 | Ohno et al. | 361/752 |
| 6,061,229 | * 5/2000 | Gates et al. | 312/223.1 X |
| 6,088,224 | * 7/2000 | Gallagher et al. | 312/223.2 X |
| 6,094,352 | * 7/2000 | Reddy et al. | 361/753 |

\* cited by examiner

*Primary Examiner*—Peter M. Cuomo
*Assistant Examiner*—Hanh V. Tran

(57) ABSTRACT

A mounting assembly includes a metallic base member, such as a wall of an enclosure. A threaded stud is fused to the base member. A threaded collar engages the threaded stud and provides a threaded recess for receiving a mounting fastener. The mounting assembly is well-suited for supporting electronic items within an enclosure in a weather-tight or waterproof manner because the mounting assembly requires no seals for an environmental barrier.

21 Claims, 3 Drawing Sheets

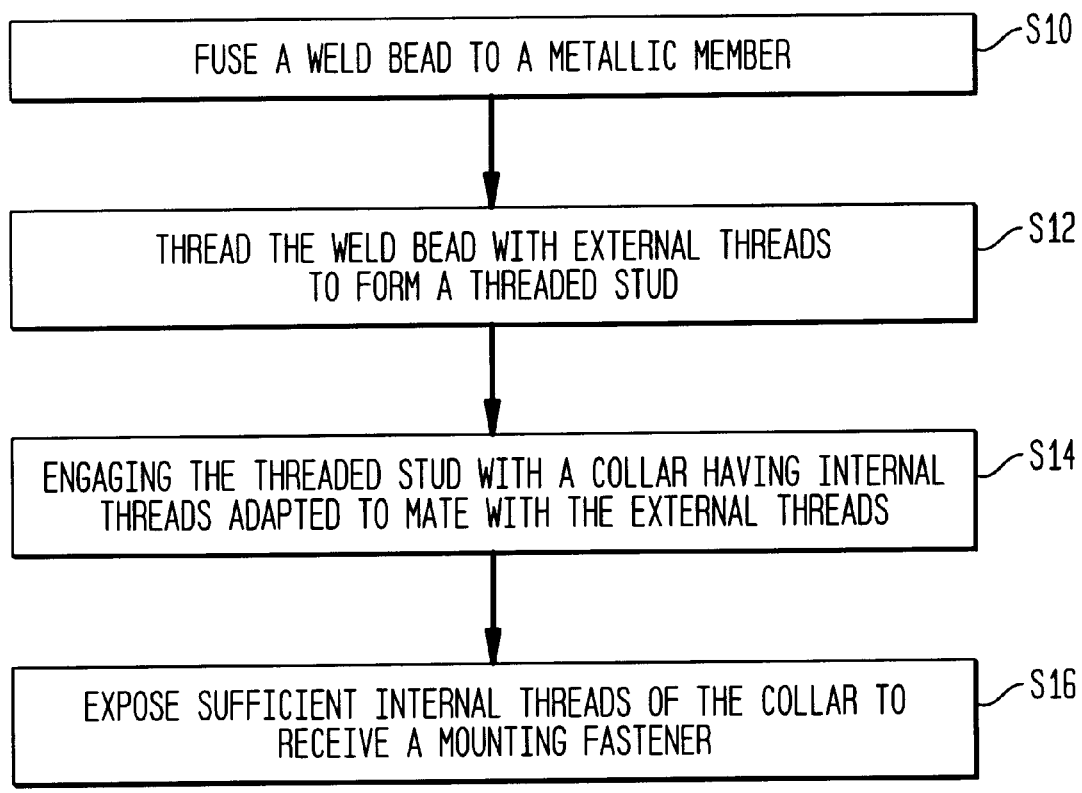

MOUNTING ASSEMBLY FOR AN ENCLOSURE

FIELD OF INVENTION

This invention relates generally to a mounting assembly for an enclosure for housing electronic equipment.

BACKGROUND

A mounting assembly is used to mount electronic modules, back-planes, shelves, circuit boards, or other electronic equipment in an enclosure. A mounting assembly sometimes compromises the environmental integrity of an enclosure, particularly where the mounting assembly engages a bore in the enclosure. The bore may provide a path for the ingress of water, dust, or other contaminants.

In the past, an elastomeric seal (e.g., silicone or rubber o-ring) was associated with the bore and the mounting assembly to weather-proof the enclosure. However, elastomeric seals used to seal such bores were susceptible to leakage and mechanical failure over time. For example, such elastomeric seals were damaged during installation when the mounting assembly required deformation to be secured to the bore.

If an exterior of the enclosure is exposed to rain, snow, ice or other sources of water, the water may penetrate the elastomeric seal. Upon exposure to the intruding water, the electronic modules within the enclosure may be damaged through one or more short-circuits created by conductive impurities (e.g., mineral salts) dispersed in the intruding water. In the context of an enclosure for wireless communications equipment, damage to an electronic module may lead to down-time of a wireless communications system or a portion thereof.

In general, an enclosure for housing communications equipment must meet various technical standards to be technically competitive and commercially marketable. For example, enclosures may be tested for salt-fog resistance and resistance to wind-driven rain at a certain rate over a certain duration and wind speed. One current technical standard involves rain testing as specified in paragraph 30 of the Underwriter's Laboratories specification UL 50 regarding "Enclosures for Electronic Equipment". Thus, the need exists for a mounting assembly and an enclosure that is sufficiently weather-tight to reduce or eliminate damage to electronic equipment housed in the enclosure.

SUMMARY OF THE INVENTION

In accordance with the invention, a mounting assembly includes a metallic base member, such as a wall of an enclosure. A threaded stud is fused to the base member. A threaded collar engages the threaded stud and provides a threaded recess for receiving a mounting fastener. The mounting assembly is well-suited for supporting an electronic item within an enclosure in a weather-tight or water-proof manner because the mounting assembly requires no seals for an environmental barrier. Further, the mounting assembly facilitates the use of threaded metallic materials that are resistant to galling and binding upon thread engagement.

In one aspect of the invention, one or more mounting assemblies are incorporated into an enclosure assembly. Accordingly, the enclosure assembly includes a metallic enclosure having an interior and an exterior. Threaded studs are fused to the interior. Threaded collars engage the corresponding threaded studs and provide threaded recesses. Mounting fasteners engage the threaded recesses for affixing one or more electronic or electrical items to the metallic enclosure. Advantageously, the mounting assemblies facilitate a barrier to water transfer between the interior and the exterior because the mounting assemblies provide reliable mechanical connection (and optionally electrical connections) to the enclosure without requiring holes in the enclosure or associated seals.

BRIEF DESCRIPTION OF THE DRAWINGS

FIG. 4 is a flow chart of a method for assembling a mounting assembly in accordance with the invention.

DETAILED DESCRIPTION

Figure 1:
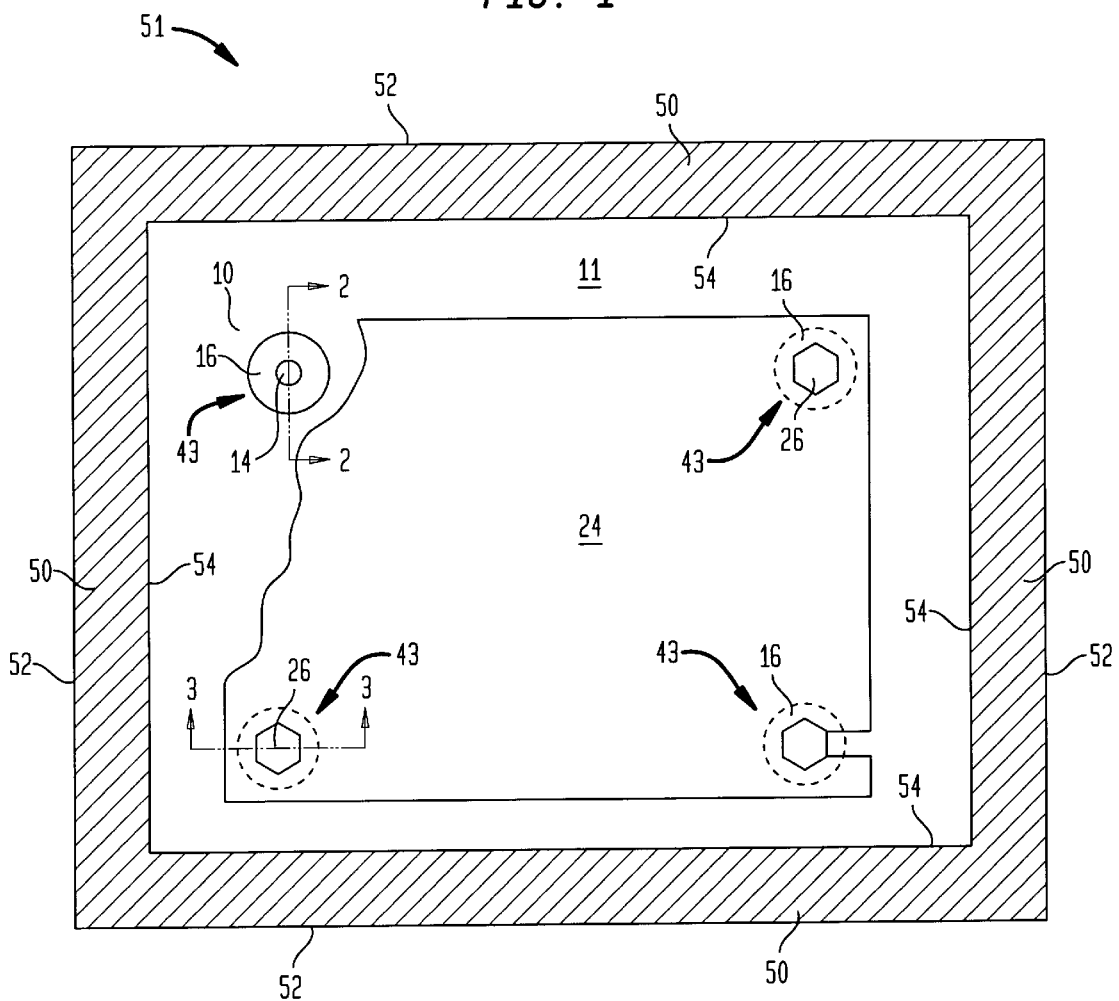
FIG. 1 is a plan view of an enclosure interior incorporating a plurality of mounting assemblies in accordance with the invention.

In accordance with the invention, in FIG. 1, an enclosure assembly 51 includes a metallic enclosure 50 having an interior 54 and an exterior 52. Threaded studs 12 (e.g., weld studs) are fused to an interior 54 of the metallic enclosure 50. The threaded stud material or its outer coating (e.g., zinc or nickel plating) is preferably compatible with the enclosure base metal to minimize galvanic corrosion and the like.

Threaded collars 16 engage corresponding threaded studs 12 and provide threaded recesses 14. The mounting fasteners 26 engage the threaded recesses 14 for affixing electrical or electronic items to the metallic enclosure 50. The mounting fastener 26 is typically composed of a metal in a manner that allows for easy thread engagement. The threaded studs 12 facilitate a reliable connection to the metallic enclosure 50 without the need for holes in the metallic enclosure 50 or attendant seals that might compromise the integrity of an environmental barrier between the interior 54 and the exterior 52.

The metallic enclosure 50 houses electrical or electronic equipment to protect the electrical or electronic equipment from exposure to environmental conditions on the exterior 52 of the metallic enclosure 50. Electronic equipment may include electronic items 24, electronic modules, electrical hardware, and electrical items, for example. The metallic enclosure 50 may house mechanical structures or mechanical equipment for supporting the operation of the electronic equipment. For example, mechanical equipment may include an air-conditioner or a heat-pump to cool the electronic equipment. Electrical hardware refers to back-planes, card shelves, cable assemblies, wire harnesses, connectors, or the like. Electronic modules refers to cards, circuit boards, circuit assemblies, or the like.

Although the metallic enclosure 50 of FIG. 1 is generally polyhedral, the metallic enclosure 50 may be of any shape, including a cylindrical shape for example. The metallic enclosure 50 includes walls to provide an environmental barrier, which is water-tight, between the interior 54 and the exterior 52.

The threaded studs may be attached to the enclosure interior 54 in accordance with three distinct techniques, depending upon the relative materials used for the threaded stud and the metallic enclosure 50 walls. In accordance with a first technique in which the substantially the same metallic materials are used for the enclosure wall 11 and the threaded stud 12, the threaded studs 12 are welded or otherwise fused to the interior 54. In accordance with a second technique in which different metallic materials are used for the enclosure wall 11, the threaded stud 12 is cladded or otherwise bonded to the interior 54. In accordance with a third technique, the stud includes a first portion that is fused to the interior 54 and a second portion that is cladded to the first portion.

In accordance with the first technique, the enclosure wall 11 and the threaded stud 12 are preferably composed of the same or a related metallic material to promote a strong fusion bond or metallurgically sound weld joint. For example, if the metallic enclosure 50 is composed of aluminum or an aluminum alloy, then the threaded studs 12 are also composed of aluminum or an aluminum alloy. In a preferred embodiment, the threaded stud 12 is composed of 6061 aluminum alloy and the metallic enclosure 50 is composed of aluminum or aluminum alloy.

In accordance with the second technique, the strength of the mounting assembly 43 may be improved by attaching a ferrous stud to metallic enclosure 50 instead of forming the threaded stud 12 of a non-ferrous metal or alloy. The ferrous stud is attached to metallic enclosure 50 composed of aluminum or an aluminum alloy by a cladding procedure. A cladding procedure involves applying suitable pressure and heat to form a bond between the ferrous stud and the enclosure wall 11. More specifically, a suitable pressure is applied to form a bond between dissimilar metals or alloys.

In accordance with a third technique, the threaded stud 12 may be fabricated bi-metallically, such that a first portion of aluminum is welded onto an aluminum enclosure and an second portion of ferrous metal is externally threaded for mounting. The second portion is cladded to the first portion.

Figure 2:
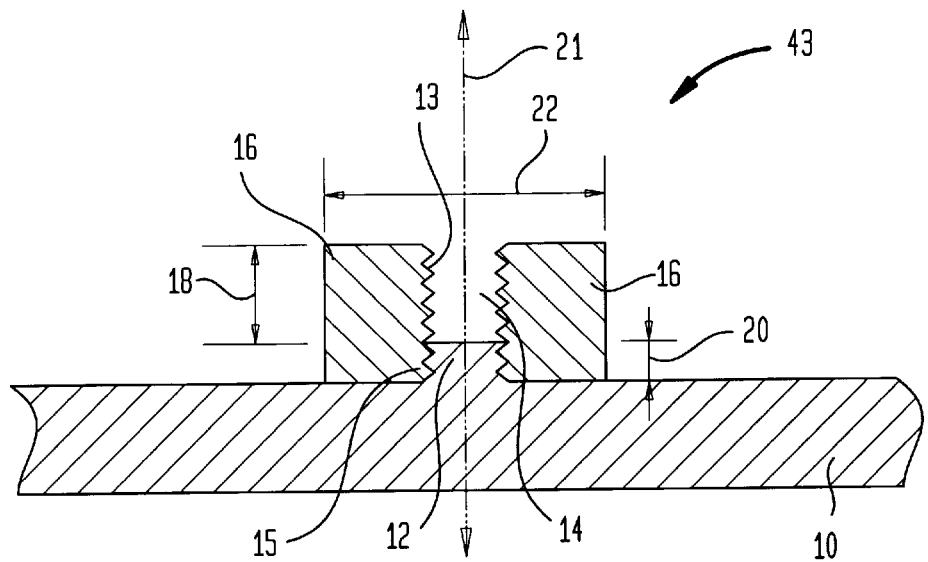
FIG. 2 is a cross-sectional view of a mounting assembly taken along reference line 2—2 of FIG. 1.

In general, the metallic enclosure 50 surrounds the electrical or electronic equipment. FIG. 2 is a cut-away view of the metallic enclosure, which reveals an electronic item 24 as the electrical or electronic equipment. The electronic item 24, shown for exemplary purposes in FIG. 2, has a plurality of receptacles 30, such as bores or slots, to accept the mounting fasteners 26 for affixing the electronic item 24 to the metallic enclosure 50. The electronic item is shown in a cut-away view in FIG. 2 to better reveal the mounting assembly 43 that would otherwise be obscured.

FIG. 2 shows a mounting assembly 43 along reference line 2—2 of FIG. 1. Like reference numerals in FIG. 1 and FIG. 2 indicate like elements. Each of the mounting assemblies 43 generally includes a metallic base member 10, which is illustratively shown as a portion of the enclosure wall 11 of the enclosure 50.

A threaded stud 12 is fused to the base member 10 or the enclosure wall 11 in the interior 54 of the enclosure 50. The threaded stud 12 has external threads 15 on its outer diameter. A threaded collar 16 has internal threads 13 corresponding in shape and size to the external threads 15 of the threaded stud 12. The external and internal threads 13 preferably correspond in pitch, pitch courseness, and diameter to permit rotational engagement upon application of the appropriate torque to the threaded collar. The threaded collar 16 is generally cylindrical as shown, although the outer diameter 22 of the threaded collar 16 may have one or more longitudinal flats to permit gripping by a tool and tightening on the threaded stud 12. The threaded collar 16 engages the threaded stud 12 and provides a threaded recess 14 for receiving a mounting fastener 26. Accordingly, no holes are required in the metallic base member 10 or the enclosure wall 11 to support the mounting assembly 43 or the attachment of an electronic or electrical equipment to the enclosure 50. The enclosure wall may be referred to as solid or continuous because of the absence of any holes for mounting the mounting assemblies 43.

The threaded collar 16 forms a structural interface between the threaded stud 12 and the mounting fastener 26. The threaded collar 16 provides support particularly where the threaded stud 12 is composed of a weaker strength metal than the mounting fastener 26. For example, the threaded stud 12 may be composed of a non-ferrous metal, such as aluminum, whereas the mounting fasteners 26 may comprise ferrous screws or bolts. The mounting fasteners 26 are preferably constructed of tempered steel, forged steel, stainless steel, or another metallic material of suitable strength. As used herein, strength predominately refers to sheer and tensile strength properties, unless specifically noted otherwise.

The threaded collar 16 cooperates with the threaded stud 12 to provide a reliable joint for electrical or electronic equipment, or another object, fastened to the mounting assembly 43. The strength of the mounting assembly 43 is a function of the shear strength of the weakest material among the threaded stud 12, the threaded collar 16, and the mounting fastener 26, along with the amount of threads of the weakest material that are engaged by the adjoining components.

The threaded collar 16 has a longitudinal axis 21. The threaded collar 16 engages a first length 20 of the threaded stud 12 along the longitudinal axis 21. The threaded collar 16 provides a threaded recess 14 of a second length 18 along the longitudinal axis 21 to receive the threaded fastener 26. The shape, size and pitch of the threaded recess 14 corresponds to shape, size, and pitch of threads 28 of the mounting fastener 26. If certain minimum thread engagement limitations are observed with certain minimum thread sizes, the structural integrity of the mounting assembly is suitable for supporting electronic equipment, electrical equipment, or other objects. Although other dimensions are suitable for the first length 20 and the second length 18, in one exemplary embodiment with a minimum thread size of M-4 (i.e., a standard metric thread size) the first length 20 is at least three-eighths of an inch long and the second length 18 is at least one-half of an inch.

The threaded collar 16 is preferably composed of stainless steel; more preferably Type 303 stainless steel. An end of the threaded collar 16 is preferably seated against an enclosure wall 11 within the interior 54 of the enclosure 50 to prevent rotation of the threaded collar 16 about the threaded stud 12 and to provide additional reinforcing support for the threaded stud 12 against torque moments transmitted to the mounting assembly 43 via the mounting fastener 26. The mounting fastener 26 supports the weight of the electronic equipment mounted therewith and consequently may apply torque moments to its mounting assembly 43.

The 6061 aluminum is approximately half as strong as steel for a comparable structural shape and size. However, for mounting assemblies of comparable size, the mounting assembly 43 with a threaded stud 12 of aluminum and a stainless steel collar 16 may approach or provide equivalent strength to that of a simple threaded ferrous joint. A simple threaded ferrous joint includes a ferrous stud for receiving a bore in an object and a nut for mating with the stud to fasten the object.

In an alternate embodiment, the threaded collar 16 may be composed of steel or an aluminum alloy.

Figure 3:
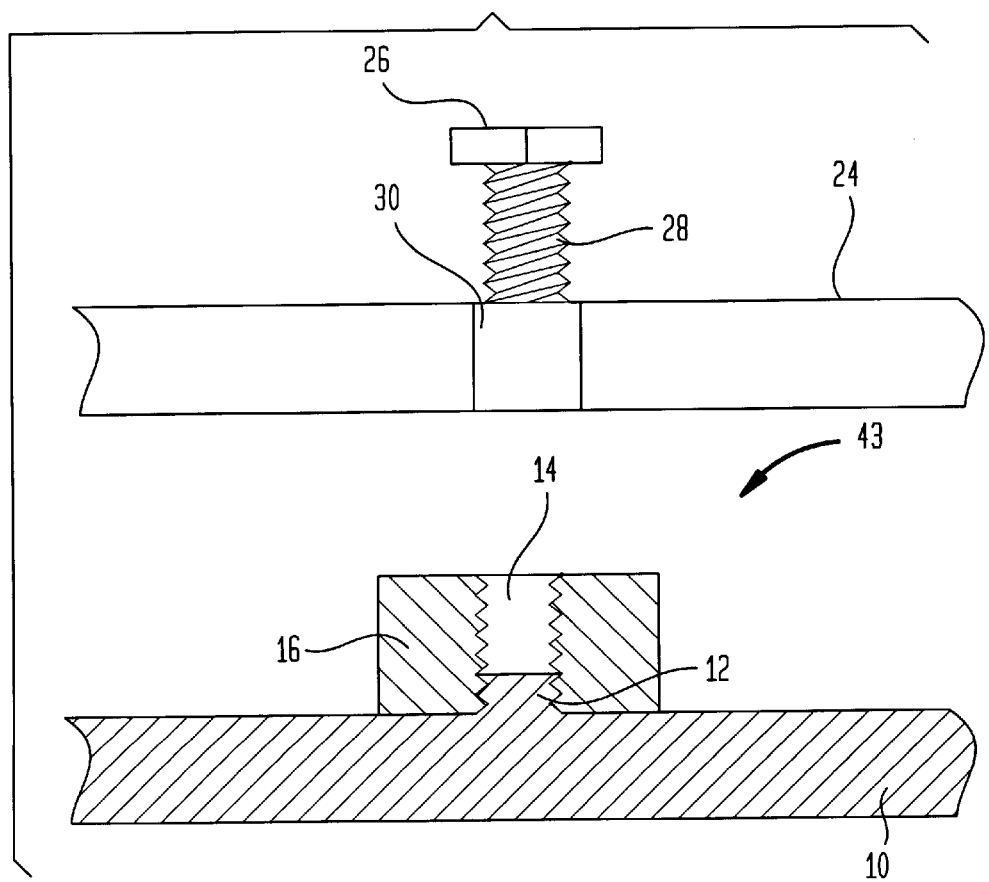
FIG. 3 is an exploded view of a mounting assembly taken along reference line 3—3 of FIG. 1.

FIG. 3 shows a mounting assembly 43 along reference line 3—3 in FIG. 1. Like reference numerals in FIG. 1 and FIG. 3 indicate like elements. In FIG. 3, the electronic item 24 is affixed to the metallic base member 10 or the enclosure wall 11 by the mounting fastener 26. The electronic item 24 has a plurality of bores for receiving the mounting fasteners 26 to affix the at least one electronic item 24 to the metallic enclosure 50.

The mounting assemblies 43 facilitate a barrier to water transfer between the interior 54 and the exterior 52 of the metallic enclosure 50 because the mounting assemblies 43 provide reliable mechanical connection to the enclosure 50 (and optionally an electrical connection to the metallic enclosure 50 if insulators are not used). The mounting assemblies 43 are mounted securely to the metallic enclosure 50 without requiring holes in the enclosure 50 or associated seals that might provide a path for the ingress of water into the metallic enclosure 50.

FIG. 4 illustrates a method for assembling a mounting assembly 43. The method for assembling starts in step S10. In step S10, a weld bead is fused to the metallic member 10 or the enclosure wall 11. Step S10 preferably includes, for example, fusing aluminum or an aluminum alloy as the weld bead to the metallic member 10, or the enclosure wall 11, composed of aluminum or an aluminum alloy.

In step S12 after step S10, the weld bead is threaded with external threads to form a threaded stud 12. Such threading may be accomplished with a suitable threader or a tap, for example. The thread formation in step S12 is usually carried out after the workpiece cools from the welding procedure of step S10.

In step S14, the collar 16 engages the threaded stud 12. For instance, the collar 16 is screwed onto the threaded stud 12 until the collar 16 seats against the base member 10 or interior 54 of the metallic enclosure 50. The collar 16 has internal threads 13 adapted to mate with the external threads of the threaded stud 12, as previously described.

In step S16, sufficient internal threads 13 of the collar 16 are exposed or otherwise reserved to receive a mounting fastener 26. In step S16 for an internal and an external thread size of M4 (i.e. a standard metric thread size), the collar 16 (e.g., stainless steel sleeve) preferably engages at least three-eighths of an inch of the threaded stud 12 along its longitudinal axis 21. The engagement of the weld stead preferably is consistent with the provision of a threaded recess 14 of at least one-half of an inch to receive the threaded fastener.

The foregoing method may further include an additional step after S16. The additional step includes fastening electronic, electrical equipment, or other objects, to the metallic member or metallic enclosure 50 wall by uniting the mounting fastener 26 within the exposed internal threads 13. For example, an electronic module 24 may be affixed to the metallic base member 10 by the mounting fastener 26.

Although the mounting assembly of the invention may be fabricated with virtually any dimensions, in a preferred embodiment, the mounting assembly is configured such that the weld-stud is at least an M-4 thread size or larger aluminum threaded stud 12 and such that the M-4 or larger stainless steel collar engages approximately twelve stud threads. M-4 refers to a standard metric thread size, which is commercially available in bolts, screws, or other fasteners. For a thread size of M-4 or larger, a thread pitch of 0.7 mm is suitable and represents a pitch of 0.7 threads per millimeter. The courseness of the threads is a measure of the pitch and the size and depth of the threads. The outer diameter 22 of the collar 16 preferably equals approximately one-quarter of an inch or greater, excluding any flats located on the outer diameter 22.

In an alternate embodiment of the mounting assembly, the collar 16 and the fastener may be replaced by a nut. To this end, a ferrous stud is attached to the metallic enclosure 50 by cladding instead of otherwise forming the threaded stud 12.

This specification describes various illustrative embodiments of the method and system of the present invention. The scope of the claims are intended to cover various modifications and equivalent arrangements of the illustrative embodiments disclosed in the specification. Therefore, the following claims should be accorded the reasonably broadest interpretations to cover modifications, equivalent structures and features which are consistent with the spirit and scope of the invention disclosed herein.

The following is claimed:

1. A mounting assembly comprising:
   a metallic base member;
   a threaded stud fused or bonded to the base member;
   a threaded collar engaging the threaded stud and providing a threaded recess for receiving a mounting fastener.

2. The mounting assembly according to claim 1 wherein the metallic base member and the threaded stud are each composed of a metallic material selected from the group consisting of an aluminum alloy and aluminum.

3. The mounting assembly according to claim 2 wherein the threaded collar is composed of stainless steel.

4. The mounting assembly according to claim 1 wherein the threaded collar has a longitudinal axis and wherein the threaded collar engages at least three-eighths of an inch of the threaded stud along the longitudinal axis.

5. The mounting assembly according to claim 4 wherein the threaded recess for receiving the threaded fastener is at least 0.5 inches deep.

6. The mounting assembly according to claim 1 wherein the metallic base member represents a portion of an enclosure for housing an electronic item.

7. An enclosure assembly comprising:
   a metallic enclosure having an interior and an exterior;
   a plurality of threaded studs fused or bonded to the interior of the metallic enclosure;
   a plurality of threaded collars engaging corresponding threaded studs and providing threaded recesses; and
   an electronic item mounted in the interior of the enclosure by a plurality of threaded mounting fasteners engaged with respective said threaded recesses.

8. The enclosure assembly according to claim 7 wherein the metallic enclosure includes a substantially solid and continuous wall to provide an environmental barrier between the interior and the exterior and wherein the threaded studs extend inward into the interior from the wall.

9. The enclosure assembly according to claim 7 wherein the metallic enclosure and each of the threaded studs are composed of a metallic material selected from the group consisting of an aluminum alloy and aluminum.

10. The enclosure assembly according to claim 9 wherein each of the threaded collars is composed of stainless steel.

11. The enclosure assembly according to claim 7 wherein each of the threaded collars has a thread size of M-4 or larger and a longitudinal axis and wherein each of the threaded collars engages at least three-eighths of an inch of its corresponding threaded stud along the longitudinal axis.

12. The enclosure assembly according to claim 7 wherein each of the threaded collars has a thread size of M-4 or larger and a longitudinal axis and wherein each of the threaded collars provides a threaded recess of at least one-half inch to receive it corresponding threaded fastener.

13. The enclosure assembly according to claim 7, wherein the electronic item has a plurality of receptacles for receiving the mounting fasteners to affix the electronic item to the metallic enclosure.

14. A method for assembling a mounting assembly:
   fusing a weld bead to a metallic member;
   threading the weld bead with external threads to form a threaded stud;
   engaging the threaded stud with a collar having internal threads adapted to mate with the external threads;
   exposing sufficient internal threads of the collar to receive a mounting fastener.

15. The method according to claim 14 further comprising the step of:
   fastening an electronic item to the metallic member by uniting the mounting fastener within the exposed internal threads.

16. The method according to claim 14 wherein the fusing step includes fusing aluminum as the weld bead to the metallic member composed of a metallic material consisting of aluminum or an aluminum alloy.

17. The method according to claim 14 wherein the fusing step includes fusing aluminum alloy as the weld bead to the metallic member composed of a metallic material consisting of aluminum or an aluminum alloy.

18. The method according to claim 14 wherein the engaging step engages the threaded stud with a stainless steel sleeve as the threaded collar.

19. The method according to claim 14 wherein the engaging step includes engaging at least three-eighths of an inch of the threaded stud along its longitudinal axis.

20. The method according to claim 14 wherein the engaging step includes providing a threaded recess of at least one-half of an inch to receive the threaded fastener.

21. The method according to claim 14 further comprising:
   affixing an electronic item to the metallic base member by the mounting fastener.

* * * * *